United States Patent [19]
Ohta

[11] Patent Number: 5,898,631
[45] Date of Patent: Apr. 27, 1999

[54] SEMICONDUCTOR STORAGE

[75] Inventor: Ken Ohta, Tokyo, Japan

[73] Assignee: NEC Corporation, Tokyo, Japan

[21] Appl. No.: 09/127,555

[22] Filed: Aug. 3, 1998

[51] Int. Cl.[6] .................................................. G11C 7/00

[52] U.S. Cl. ............................................................ 365/203

[58] Field of Search ..................................... 365/203, 190, 365/207, 51

[56] References Cited

U.S. PATENT DOCUMENTS

| | | | |
|---|---|---|---|
| 5,469,395 | 11/1995 | Kuwabara et al. | 365/203 |
| 5,604,704 | 2/1997 | Atsumo | 365/203 |

*Primary Examiner*—David Nelms
*Assistant Examiner*—Trong Phan
*Attorney, Agent, or Firm*—Foley & Lardner

[57] ABSTRACT

Disclosed is a dynamic-type semiconductor storage which has: a circuit block, which is herein called PDL, to conduct the precharging and balancing of a bit line; wherein the layout pattern of PDL is formed having a same pattern as that of a memory cell transistor.

3 Claims, 6 Drawing Sheets

SEMICONDUCTOR STORAGE

FIELD OF THE INVENTION

This invention relates to a semiconductor storage, and more particularly to, a dynamic random access memory (hereinafter referred to as 'DRAM') with a circuit block, herein called 'precharge digit line (PDL)', to conduct the precharge/balance of bit line.

BACKGROUND OF THE INVENTION

DRAM with stacked memory cell and PDL is known. PDL is a circuit used to precharge and balance a pair of digit lines with a power source or ground level when a rewriting into memory cell is completed after amplifying a memory cell data. PDL has a form distinct from that of the memory cells.

In a place, such as a memory cell array, that a high-density pattern is regularly disposed, a pattern deformation can happen around the border where the pattern regularity is deteriorated. This is called 'micro-loading effect'. Namely, it is a phenomenon that an etching speed is reduced as a diameter of hole or etching width is shortened.

When PDL is disposed in a memory cell array, stacked polysilicon may be deformed by micro-loading effect, and thereby the cell capacitance around PDL may be dispersed.

Also, when a dummy word line is disposed to suppress the dispersion of cell capacitance, the layout size has to be increased.

SUMMARY OF THE INVENTION

Accordingly, it is an object of the invention to provide a semiconductor storage that the layout size can be reduced while suppressing micro-loading effect.

It is a further object of the invention to provide a semiconductor storage that a reduction in precharge/balance speed due to bit-line resistance and capacitance can be prevented.

According to the invention, a dynamic-type semiconductor storage, comprises:

a circuit block, which is herein called PDL, to conduct the precharging and balancing of a bit line;

wherein the layout pattern of PDL is formed having a same pattern as that of a memory cell transistor.

According to another aspect of the invention, a dynamic-type semiconductor storage, comprises:

a circuit block, which is herein called PDL, to conduct the precharging and balance of a bit line;

wherein PDL is disposed in a dummy word-line region adjacent to a memory cell array while removing the dummy word-line region, and, of the layout pattern of PDL, part except polysilicon to form a capacitor has a same form as a memory cell transistor.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a semiconductor storage in the preferred embodiments, the aforementioned conventional semiconductor storage will be explained in FIGS. 1 and 2.

Figure 1:
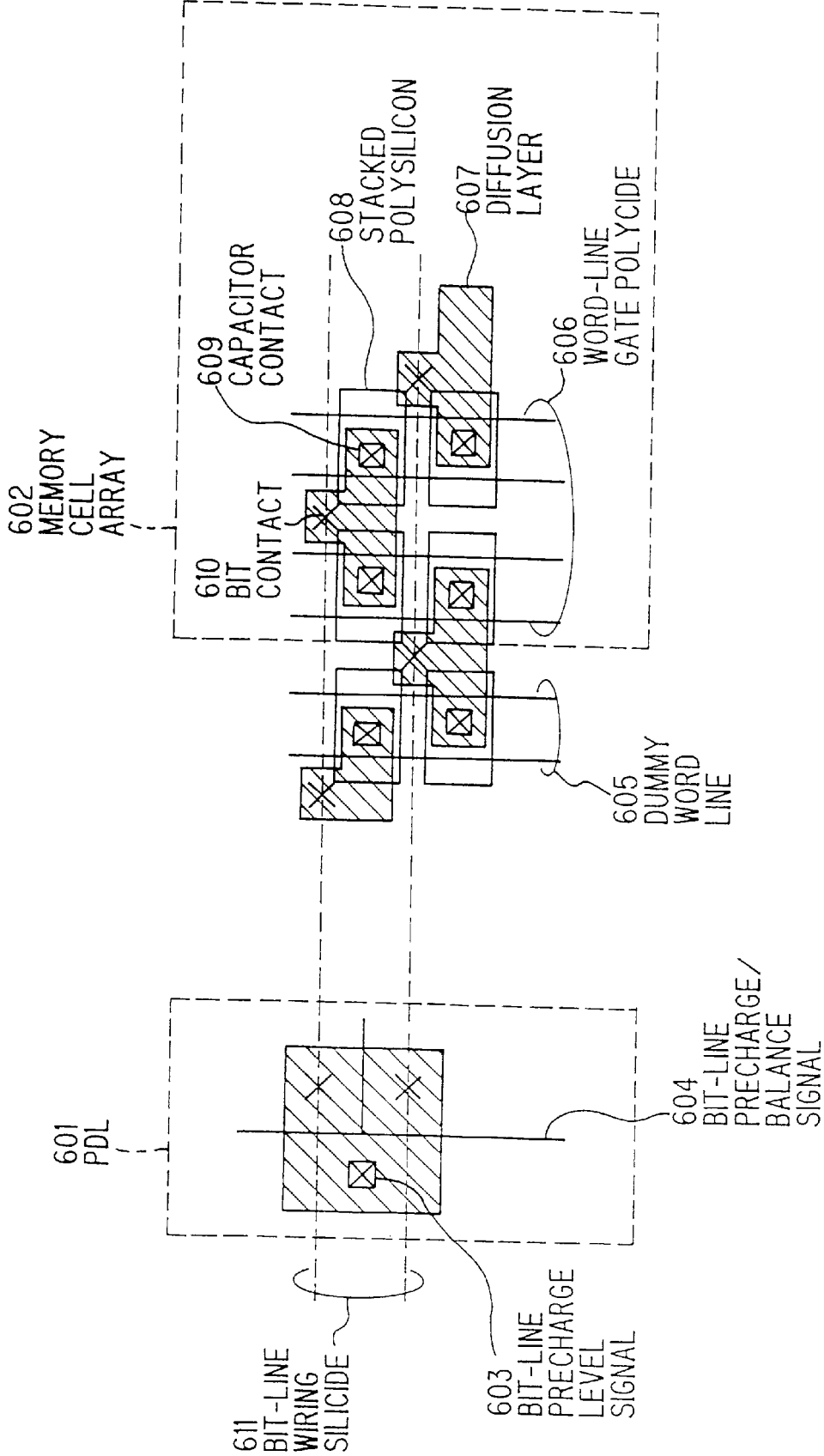
FIG. 1 is a layout diagram showing a conventional semiconductor storage.

FIG. 1 shows a typical layout of stacked memory cell and PDL in DRAM.

FIG. 1, as a matter of convenience, only a pair of bit lines 611 and a 4-bit memory cell array 602 are shown. However, in a normal DRAM, these are repeatedly laid out. Similarly, cell common line polysilicon (capacitor polysilicon) is not shown. Meanwhile, a dummy word line is described later.

Figure 2:
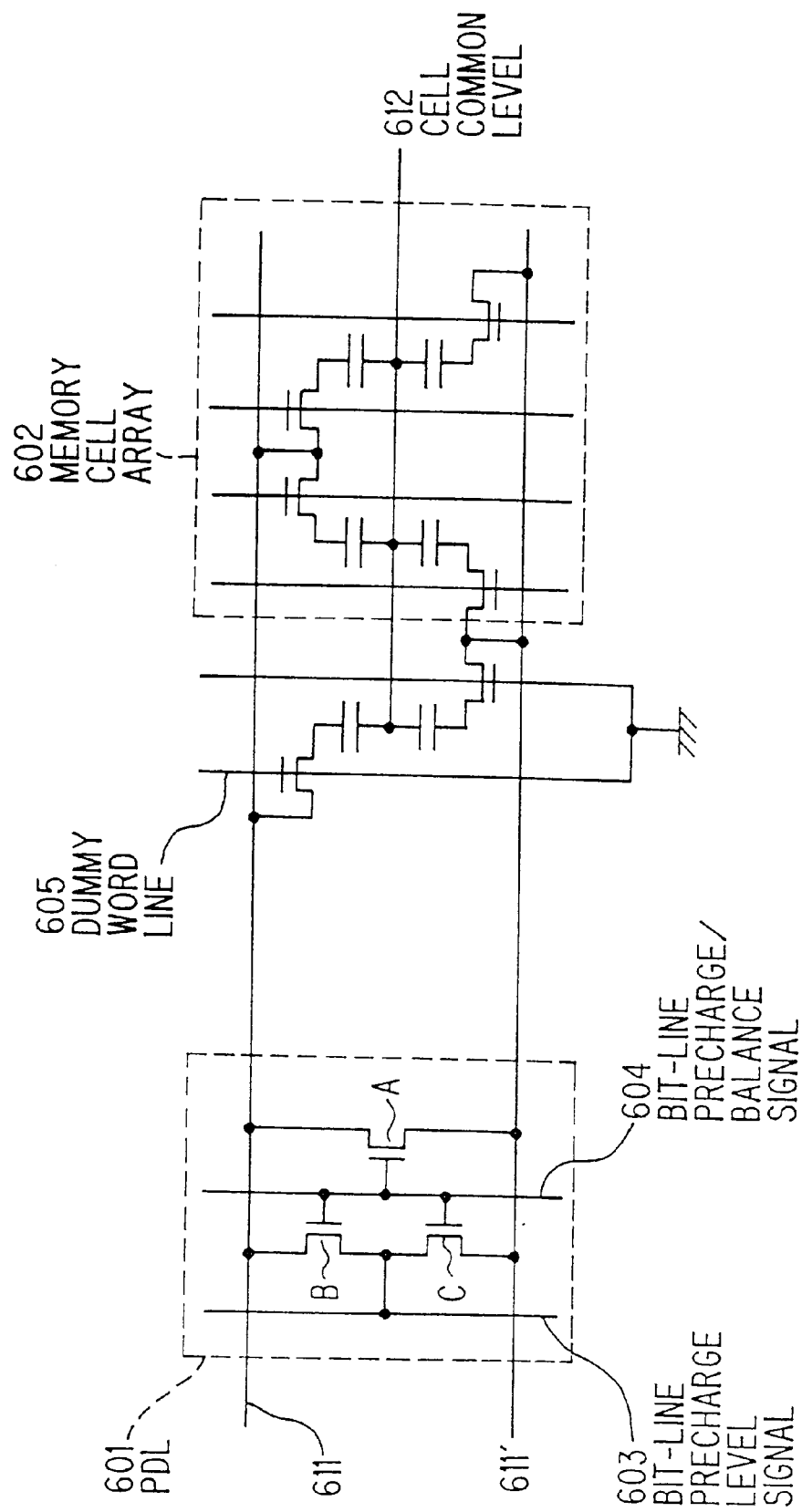
FIG. 2 is the equivalent circuit of the structure in FIG. 1.

FIG. 2 is a circuit diagram corresponding to the layout in FIG. 1. PDL is composed of a transistor A connecting between a pair of bit lines, and transistors B, C connecting between a pair of bit lines 611, 611' and a precharge level signal 603. All the transistors A, B and C input a bit-line precharge signal 604 to gate.

With the transistors A, B and C formed as a n-type transistor, when the bit-line precharge signal 604 becomes H level, a pair of bit lines are balanced and simultaneously set to have a precharge level. Even when the transistor A is not provided, the pair of bit lines can be balanced. However, to enhance the balance speed, the digit lines (pair of bit lines) are connected through the one-stage transistor A.

Figure 3:
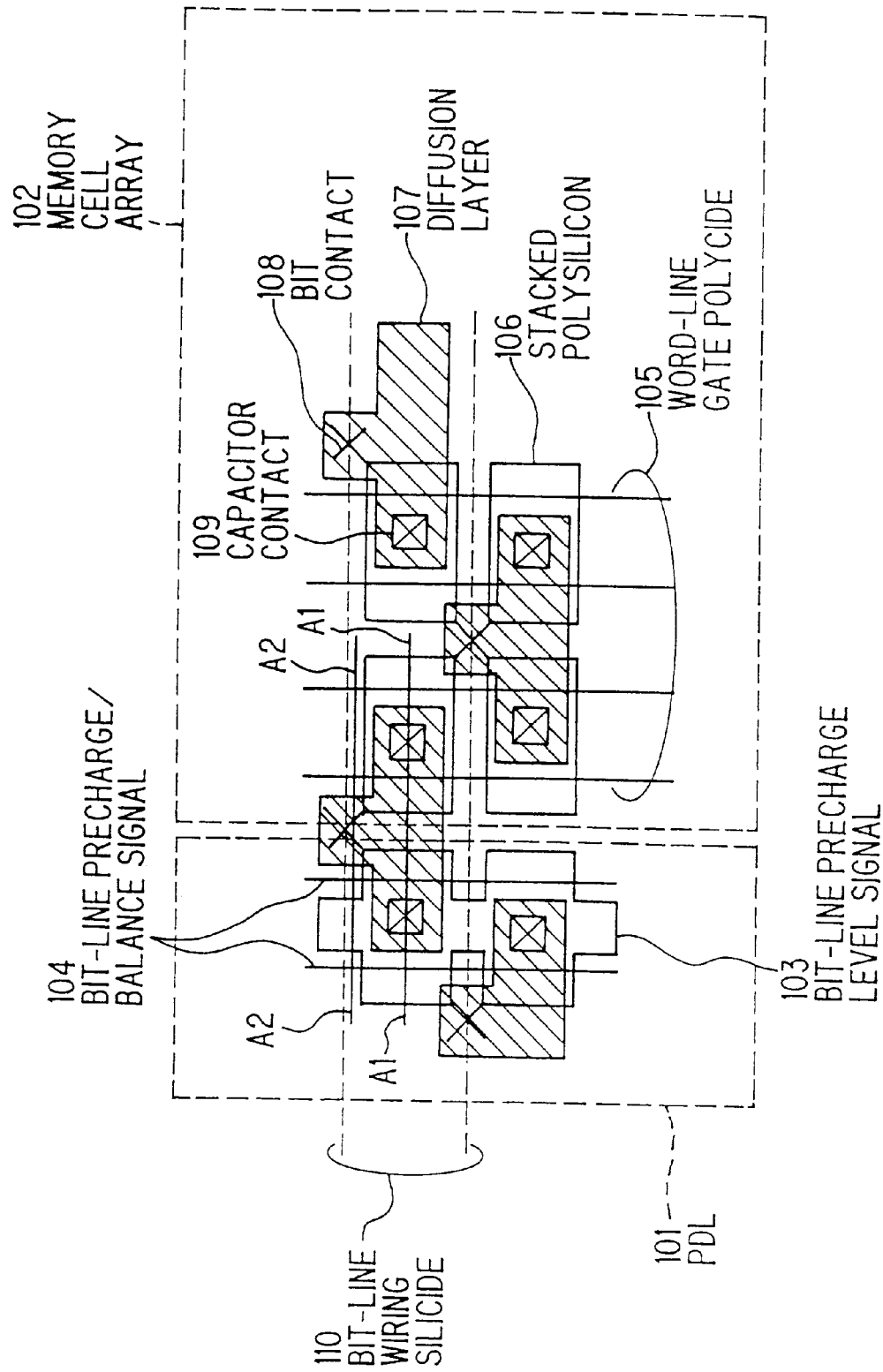
FIG. 3 is a layout diagram showing a semiconductor storage in a first preferred embodiment according to the invention.
Figure 4:
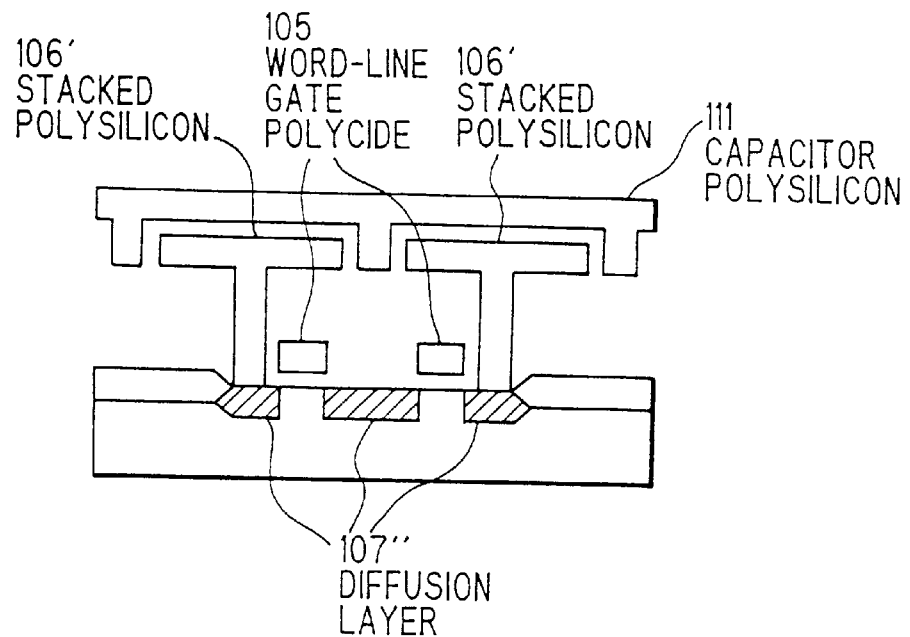
FIG. 4 is a cross sectional view cut along the line A1—A1 in FIG. 3.
Figure 5:
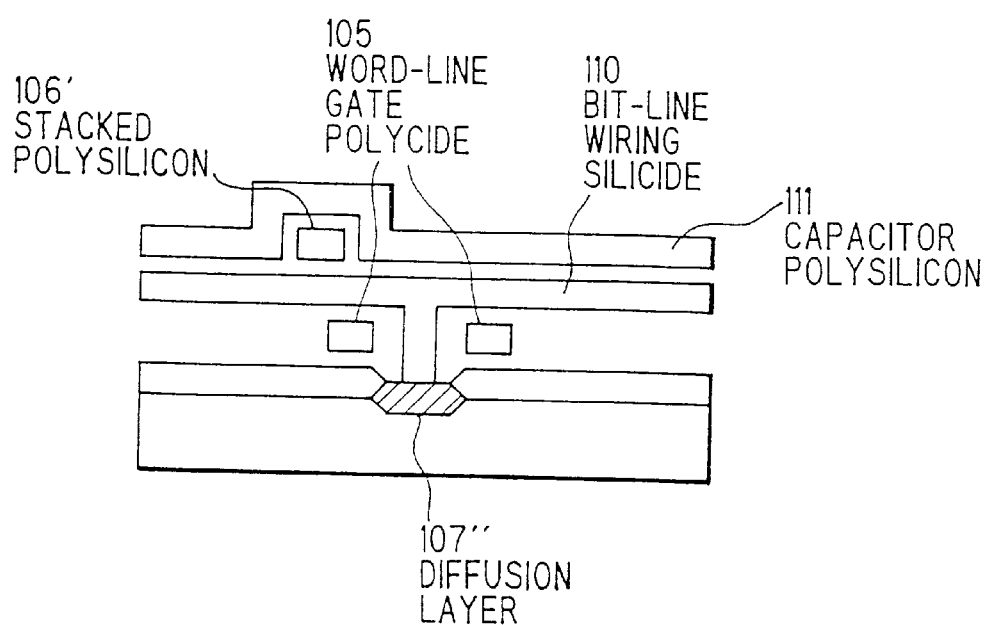
FIG. 5 is a cross sectional view cut along the line A2—A2 in FIG. 3.
Figure 6:
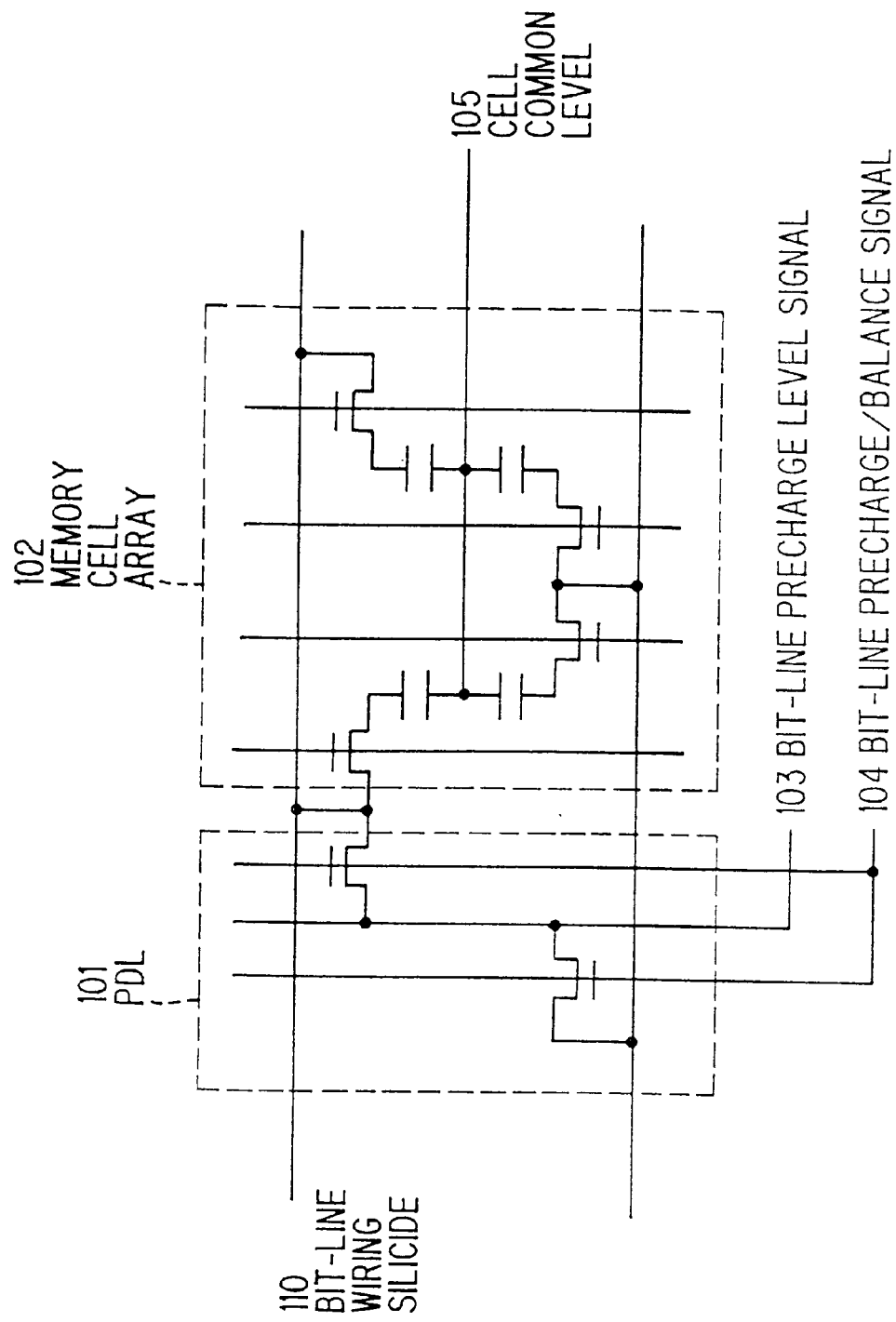
FIG. 6 is the equivalent circuit of the structure in FIG. 3.

Next, a semiconductor storage in the first preferred embodiment will be explained in FIGS. 3 to 6. FIG. 3 shows a layout of stacked memory cell array and PDL in the first embodiment. FIG. 4 is a cross sectional view cut along the line A1—A1 in FIG. 3. FIG. 5 is a cross sectional view cut along the line A2—A2 in FIG. 3. FIG. 6 is the equivalent circuit of the structure in FIG. 3.

In the first embodiment, as shown in FIG. 3, of the layout pattern of PDL 101, part except stacked polysilicon to form a capacitor has a same form as memory cells. Therefore, micro-loading effect at a memory cell adjacent to PDL can be prevented. Even if the stacked polysilicon 106' of PDL 101 is deformed by micro-loading effect, there occurs no problem because PDL 101 does not use it as a capacitor.

Also, a bit-line precharge level signal 103, which was typically connected by metal wiring, is formed by high-resistance stacked polysilicon 106'. In this regard, a reduction in precharge speed may be concerned. However, (1), in general, a precharge level is laid at a level (called 'HVCC' level) being just intermediate between power source and ground, and (2) though, of a pair of bit lines before the precharge, one is at power source level and the other is at ground level, both can be balanced to come nearby HVCC as the precharge level. From these points, it will be appreciated that the precharge speed is not predominant over the balance speed. Thus, there is no problem even when a slight resistance is added to the precharge level signal 103.

Next, a reduction in balance speed due to the use of stacked polysilicon is considered. Even when the sheet resistance of stacked polysilicon is high, the pair of bit lines can be connected having a resistance value of tens of ohms because a wiring length to connect between the precharge transistor and the pair of bit lines is short. The resistance value is sufficiently small, compared with the ON resistance value of the transistor. Thus, the reduction in balance speed due to the use of stacked polysilicon is not so significant.

Accordingly, by disposing PDL in the dummy word-line region, the layout size can be reduced by the PDL area in the conventional layout. For example, when applied to a 16 Mbit product manufactured by the assignee of this application, the chip size can be reduced by about 2 to 3%.

Meanwhile a reduction in balance speed may be also concerned because a transistor that corresponds to the transistor A in FIG. 2 for bit-line balancing is not provided in the semiconductor storage of this embodiment. However, by disposing PDL, which was disposed only on one side of the bit line, on both sides of the bit line, a delay due to bit-line resistance and capacitance can be reduced. As a result, a same performance as the conventional semiconductor storage can be obtained.

A semiconductor storage in the second preferred embodiment will be explained in FIG. 7.

Figure 7:
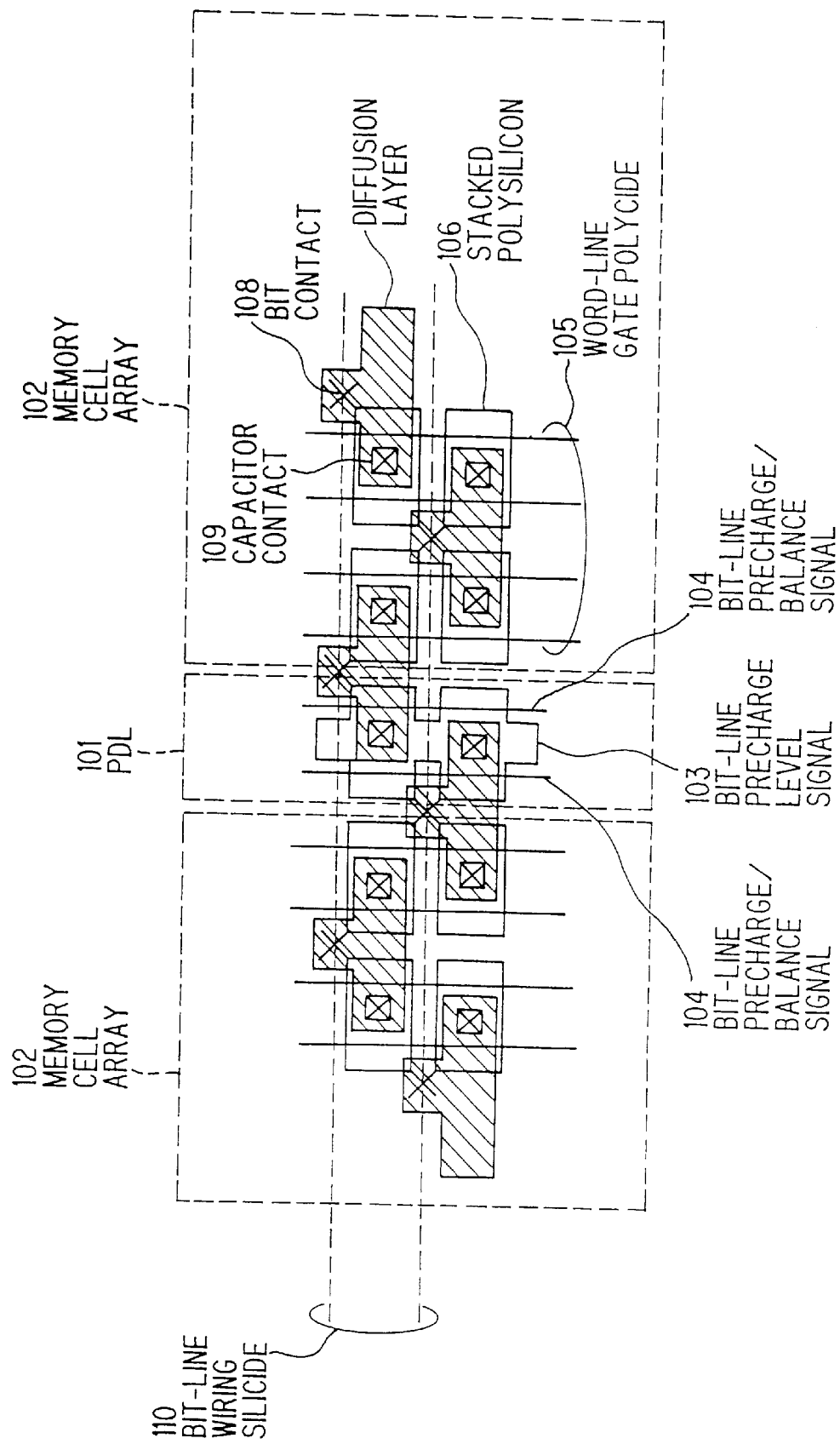
FIG. 7 is a layout diagram showing a semiconductor storage in a second preferred embodiment according to the invention.

Referring to FIG. 7, the second embodiment is different from the first embodiment in that PDL 101 is disposed inside the memory cell array 102.

As to the circuit composition, the second embodiment is identical with the first embodiment. Thus, by providing part except stacked polysilicon to form a capacitor with a same form as memory cells, PDL can be disposed inside the memory cell array without causing micro-loading effect.

Conventionally, the PDL circuit was disposed on one side of a long bit line. Therefore, at the end of the bit line, a delay of several ns existed due to a resistance and capacitance of the bit line. For example, when the total transistor size of the PDL circuits in this invention is equalized to that of the conventional PDL and they are disposed at six positions on the bit line, it is estimated that the delay is about one sixth of that of the conventional. In this case, the layout size can be kept nearly equal by using the dummy word-line region in the conventional semiconductor storage.

Although the invention has been described with respect to specific embodiment for complete and clear disclosure, the appended claims are not to be thus limited but are to be construed as embodying all modification and alternative constructions that may be occurred to one skilled in the art which fairly fall within the basis teaching here is set forth.

What is claimed is:

1. A dynamic-type semiconductor storage, comprising:
   a circuit block, which is herein called PDL, to conduct the precharging and balancing of a bit line;
   wherein the layout pattern of said PDL is formed having a same pattern as that of a memory cell transistor.

2. A dynamic type semiconductor storage, comprising:
   a circuit block, which is herein called PDL, to conduct the precharging and balancing of a bit line;
   wherein said PDL is disposed in a dummy word-line region adjacent to a memory cell array while removing the dummy word-line region, and, of the layout pattern of said PDL, part except polysilicon to form a capacitor has a same form as a memory cell transistor.

3. A dynamic-type semiconductor storage, according to claim 2, wherein:
   a bit-line precharge level signal is formed by said stacked polysilicon.

* * * * *

UNITED STATES PATENT AND TRADEMARK OFFICE
CERTIFICATE OF CORRECTION

PATENT NO.   : 5,898,631
DATED        : April 27, 1999
INVENTOR(S)  : Ken OHTA

It is certified that error appears in the above-identified patent and that said Letters Patent is hereby corrected as shown below:

On the title page: Item

--[30] Foreign Application Priority Data--
--Japan   No. 9-220889, filed August 1, 1997--

Signed and Sealed this

Twenty-eighth Day of March, 2000

Attest:

Q. TODD DICKINSON

*Attesting Officer*    *Commissioner of Patents and Trademarks*